United States Patent
Shiode

(10) Patent No.: US 7,495,742 B2
(45) Date of Patent: Feb. 24, 2009

(54) MEASURING METHOD AND APPARATUS, EXPOSURE METHOD AND APPARATUS USING THE SAME, AND DEVICE MANUFACTURING METHOD

(75) Inventor: Yoshinori Shiode, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 149 days.

(21) Appl. No.: 11/013,252

(22) Filed: Dec. 15, 2004

(65) Prior Publication Data

US 2005/0128447 A1 Jun. 16, 2005

(30) Foreign Application Priority Data

Dec. 15, 2003 (JP) ............... 2003-417212

(51) Int. Cl.
*G03B 27/68* (2006.01)
*G03B 27/42* (2006.01)
*G03B 27/32* (2006.01)

(52) U.S. Cl. .............. 355/52; 355/53; 355/77

(58) Field of Classification Search ............ 355/52–53, 355/55, 77
See application file for complete search history.

(56) References Cited

U.S. PATENT DOCUMENTS

| 5,661,548 | A | * | 8/1997 | Imai | ............ 355/55 |
|---|---|---|---|---|---|
| 5,828,455 | A | | 10/1998 | Smith et al. | |
| 6,633,390 | B2 | | 10/2003 | Shiode et al. | |
| 6,960,415 | B2 | | 11/2005 | Shiode | |
| 7,190,443 | B2 | | 3/2007 | Shiode | |
| 2002/0015158 | A1 | * | 2/2002 | Shiode et al. | ............ 356/614 |
| 2002/0159040 | A1 | * | 10/2002 | Hamatani et al. | ............ 355/52 |
| 2003/0091913 | A1 | * | 5/2003 | Shiode | ............ 430/22 |
| 2003/0133099 | A1 | * | 7/2003 | Shiode | ............ 356/124 |
| 2004/0109148 | A1 | * | 6/2004 | Shima | ............ 355/52 |

FOREIGN PATENT DOCUMENTS

| JP | 2001-264582 | 9/2001 |
|---|---|---|
| JP | 2002-289494 | 10/2002 |
| JP | 2003-178968 | 6/2003 |
| JP | 2003-318090 | 11/2003 |

* cited by examiner

*Primary Examiner*—Peter B Kim
(74) *Attorney, Agent, or Firm*—Morgan & Finnegan, LLP

(57) ABSTRACT

A method for measuring an optical performance of a projection optical system in an exposure apparatus that exposes a pattern on a reticle onto a substrate includes the steps of determining an pupil area in the projection optical system, scanning a test reticle or a reference plate, imaging a test pattern on the test reticle or the reference plate onto a surface of the substrate via the pupil area in the projection optical system which has been determined by the determining step, and measuring a positional offset between a predetermined position and an image of the test pattern that has been imaged by the imaging step.

7 Claims, 20 Drawing Sheets

MEASURING METHOD AND APPARATUS, EXPOSURE METHOD AND APPARATUS USING THE SAME, AND DEVICE MANUFACTURING METHOD

BACKGROUND OF THE INVENTION

The present invention relates generally to a measuring method and apparatus, and more particularly to a measuring method and apparatus for measuring an optical performance, such as a wave front aberration and the best focus position, of a projection optical system for transferring a pattern on a mask onto an object, and an exposure method and apparatus that are corrected using the measuring method and apparatus. The inventive measuring method and apparatus are suitable, for example, for measurements of the projection optical system used for a step-and-scan exposure apparatus or a scanner. The step-and-scan exposure apparatus exposes a mask pattern onto a wafer by continuously scanning the wafer relative to the mask, and by moving, after one shot of exposure, the wafer stepwise to the next exposure area to be shot.

A projection exposure apparatus has conventionally been used to transfer a pattern on a mask or a reticle onto an object to be exposed in manufacturing semiconductor devices in the photolithography process. A type of the exposure apparatus is shifted from the step-and-repeat exposure apparatus ("stepper") to the scanner. The exposure apparatus is required to transfer a pattern on the reticle onto the object at a predetermined magnification with precision, and exposure at the best focus position using a projection optical system having a reduced aberration is important. In particular, due to the recent increasing demands for the finer processing to the semiconductor devices, the transfer pattern is sensitive to the aberration of the optical system. Therefore, there is a demand for highly precise measurements of the best focus position and wave front aberration of the projection optical system.

The instant inventor has already proposed one solution method for this problem for imaging a pattern on the reticle with the light irradiated by an illumination optical system, and for measuring a wave front aberration of the projection optical system based on a positional offset between a reference position and a center of the formed image. See, for example, Japanese Patent Application, Publication No. 2003-178968.

Other prior art references include Japanese Patent Applications, Publication Nos. 2003-318090 and 2002-289494, and U.S. Pat. Nos. 5,828,455 and 5,978,085.

Japanese Patent Application, Publication No. 2003-178968 maintains the mask stage and the wafer stage still during the measurement. The instant inventor has discovered that this method is suitable for the stepper but not always suitable for the scanner. There are two types of measurements for the scanner: One maintains these stages still during the measurement, and the other dynamically scans these stages during the measurement. The measurement of the best focus position at the scan state is different from that at the still state in that the measurement at the scan state needs to measure the control performance of the exposure apparatus in the focus direction (or the Z direction) in a real-time basis during scanning. In measuring the aberration of the projection optical system, the mask is scanned with a normal slit illumination (while the wafer is also scanned at the same time), and the entire exposure area on the mask is exposed. The slit has a predetermined width in the scan direction, and the resist image depends upon the integration of rays from an image point range corresponding to the slit width. Unlike the measurement at the still state, the aberration of the projection optical system in the measurement at the scan state should address an integration of the aberrations in the image point range corresponding to the slit width, rather than the aberration for one image point. Therefore, Japanese Patent Application, Publication No. 2003-178968 and other prior art references, which maintain the stages still during the measurement, cannot precisely measure the best focus position and the wave front aberration of the projection optical system with precision.

BRIEF SUMMARY OF THE INVENTION

Accordingly, it is an exemplary object of the present invention to provide a measuring method and apparatus for measuring the optical performance, such as an aberration and the best focus position, of a target optical system more precisely than the prior art, an exposure method and apparatus using the same, and a device manufacturing method.

A method according to one aspect of the present invention for measuring an optical performance of a projection optical system in an exposure apparatus that exposes a pattern on a reticle onto a substrate, includes the steps of determining an pupil area in the projection optical system, scanning a test reticle or a reference plate, imaging a test pattern on the test reticle or the reference plate onto a surface of the substrate via the pupil area in the projection optical system which has been determined by the determining step, and measuring a positional offset between a predetermined position and an image of the test pattern that has been imaged by the imaging step.

A measuring apparatus according to another aspect of the present invention for measuring an optical performance of a target optical system, includes an illumination optical system for illuminating a test pattern that extends in a predetermined direction by using measuring light, a drive unit for scanning the test pattern in the predetermined direction relative to the measuring light; and a measuring unit for measuring a position of an aerial image or an image on a substrate imaged by the target optical system, by introducing, to the target optical system, the measuring light that passed the pattern.

A measuring method according to another aspect of the present invention for measuring an optical performance of a target optical system, includes the steps of obtaining information on a position of an aerial image or an image on a substrate imaged by the target optical system, by scanning a pattern that extends in a predetermined direction with measuring light, and by introducing, to the target optical system, the measuring light that has passed the pattern, and calculating the optical performance of the target optical system from the information obtained by the obtaining step.

An exposure method according to another aspect of the present invention includes the steps of adjusting a projection optical system as a target optical system based on the optical performance that has been calculated by utilizing the above measuring method, and exposing an object by using the projection optical system that has been adjusted by the adjusting step.

An exposure apparatus according to another aspect of the present invention for exposing a pattern on a reticle onto an object in a step and scan manner, includes a projection optical system for projecting the pattern onto the object, and a measuring apparatus according to claim 6 for measuring an optical performance of the projection optical system.

A device manufacturing method according to another aspect of the present invention includes the steps of exposing an object using the above exposure apparatus, and developing the object that has been exposed.

Other objects and further features of the present invention will become readily apparent from the following description of the preferred embodiments with reference to the accompanying drawings.

DETAILED DESCRIPTION OF THE PREFERRED EMBODIMENTS

Figure 2:
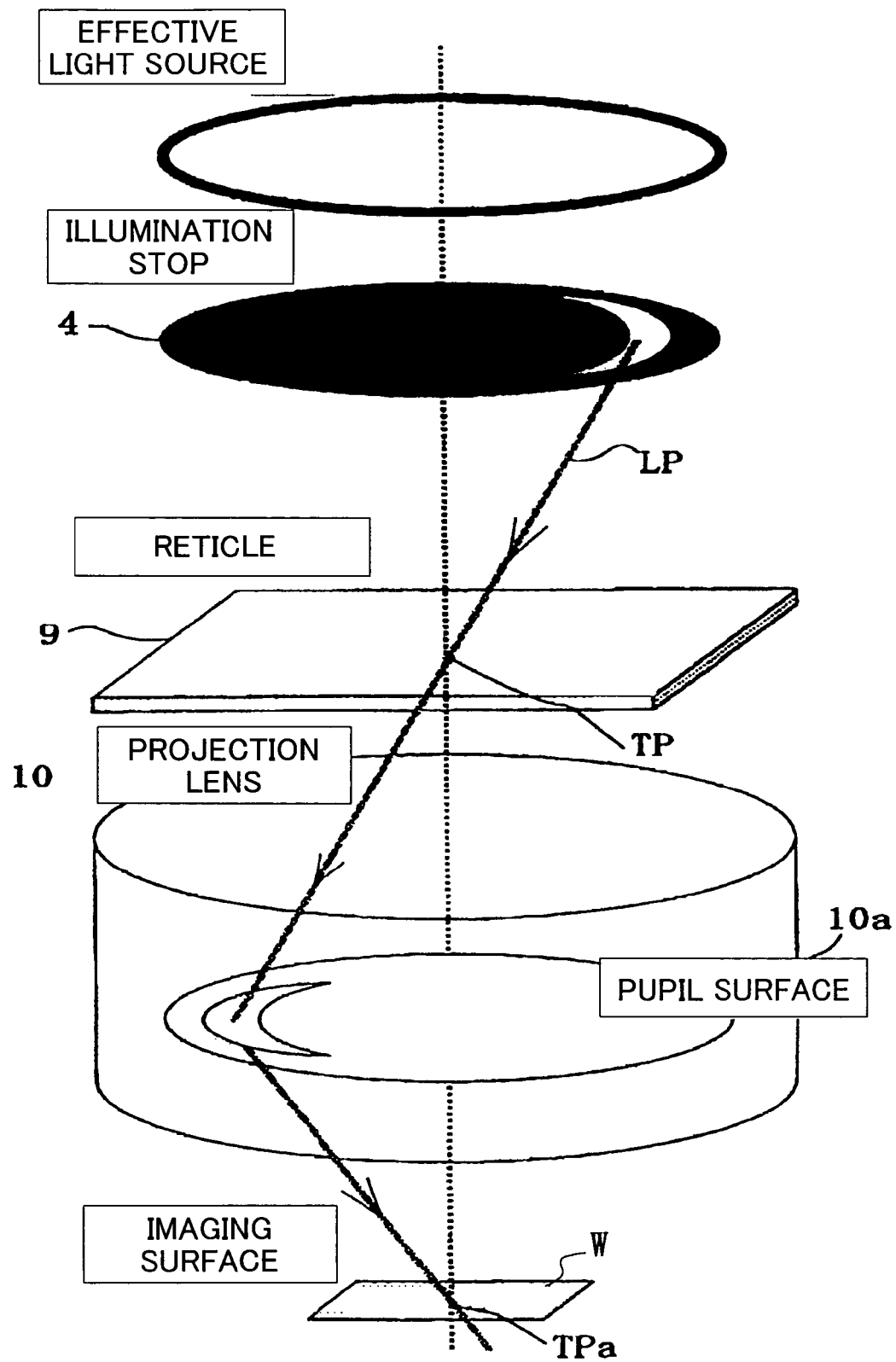
FIG. 2 is a typical view for explaining a measurement principle according to another embodiment of the present invention.
Figure 5A:
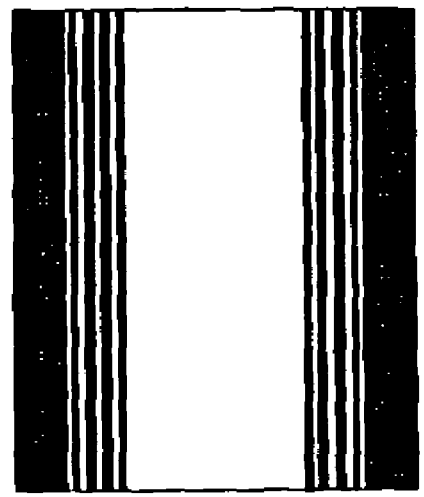
FIGS. 5A and 5B are plane views of a test pattern usable for the inventive measurement method.
Figure 5B:
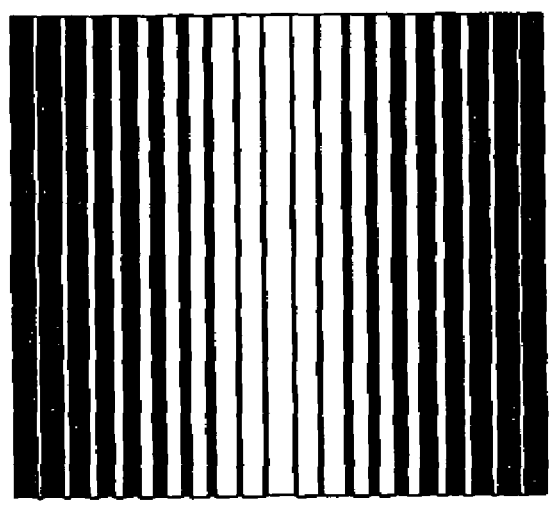

Referring now to FIG. 2, a description will be given of a measurement principle according to a first embodiment of the present invention. Here, FIG. 2 is a schematic perspective view for explaining a measuring apparatus. In FIG. 2, the measuring apparatus forms one or more patterns ("test pattern") on a reticle 9, irradiates a principal ray onto the reticle 9 via a stop for oblique incidence illumination provided on an aperture surface in the illumination optical system and disclosed in Japanese Patent Application, Publication No. 2002-289494, an illumination stop 4 having a special shape disclosed in Japanese Patent Applications, Publication Nos. 2003-178968 and 2003-318090, and a reference plate (or a test reticle) shown (see FIGS. 5A and 5B) having a special optical element, and measures a positional offset amount between a reference position and a position of an aerial image or a pattern image TPa transferred onto a photosensitive substrate W, which is the test pattern TP on the reticle 9 imaged by a projection lens 10. The test pattern TP may be formed on another reference plate rather than the reticle 9. The best focus position or aberration of the projection optical system 10 is measured by measuring the aerial image or the transferred pattern image TPa.

The test pattern TP uses another pattern or a periodic pattern proposed in Japanese Patent Application No. 2001-264582 by this inventor, which has approximately the same pitch or interval between lines and spaces, and individual space widths that transmit the light reduce from a centerline of the periodic pattern or a pattern of the center space to the outer patterns.

These patterns reduce the diffracted light, and form a light intensity distribution approximately close to the illumination aperture stop 4's shape on a pupil surface 10a in the projection lens 10. The light intensity distribution of a pattern image formed through the projection lens 10 can be regarded as one large pattern that has less distortion and does not resolve a gap between the lines. As disclosed in Japanese Patent Applications, Publication Nos. 2003-178968 and 2003-318090, the opening shape of the special illumination aperture stop 4 is optimized with a specific Zernike term or the aberration of a real device pattern by means of a database of the Zernike sensitivity to positional offset amounts, which has been previously calculated for each position on a pupil surface of the projection lens 10. In other words, the illumination optical system's effective light source distribution is set and the light that passes the pupil area in the projection optical system is restricted so that the positional offset amount of the test pattern image from a predetermined position depends primarily on one of the coefficients with respect to the specific Zernike term or the real device pattern. In particular, the illumination optical system's effective light source distribution is set and the light that passes the pupil area in the projection optical system is restricted so that the positional offset amount of the test pattern image from a predetermined position have a 1:1 relationship with one of the coefficients with respect to the specific Zernike term or the real device pattern.

This embodiment irradiates the principal ray LP onto the test pattern TP on the reticle 9 via the illumination optical system having an optimized aperture stop shape, and measures the aerial image imaged by the test pattern TP on the reticle 9 or transfers the pattern image TPa on the photosensitive substrate. Next, this embodiment changes a direction of the principal ray by rotating the aperture stop 4 in the illumination optical system or by replacing the aperture stop 4 with a different aperture stop, and measures the aerial image imaged by the test pattern TP on the reticle 9 or transfers the pattern image TPa on the photosensitive substrate. By repeating the above steps, this embodiment measures the specific Zernike coefficient or the aberration of the real device pattern on the pupil surface 10a on the projection optical system 10.

The above approach is applicable to the measurement of the best focus position. In this case, it is unnecessary to optimize the shape of the illumination optical system's stop 4, and only the oblique incident illumination disclosed in Japanese Patent Application, Publication No. 2002-289494 is enough.

Figure 1:
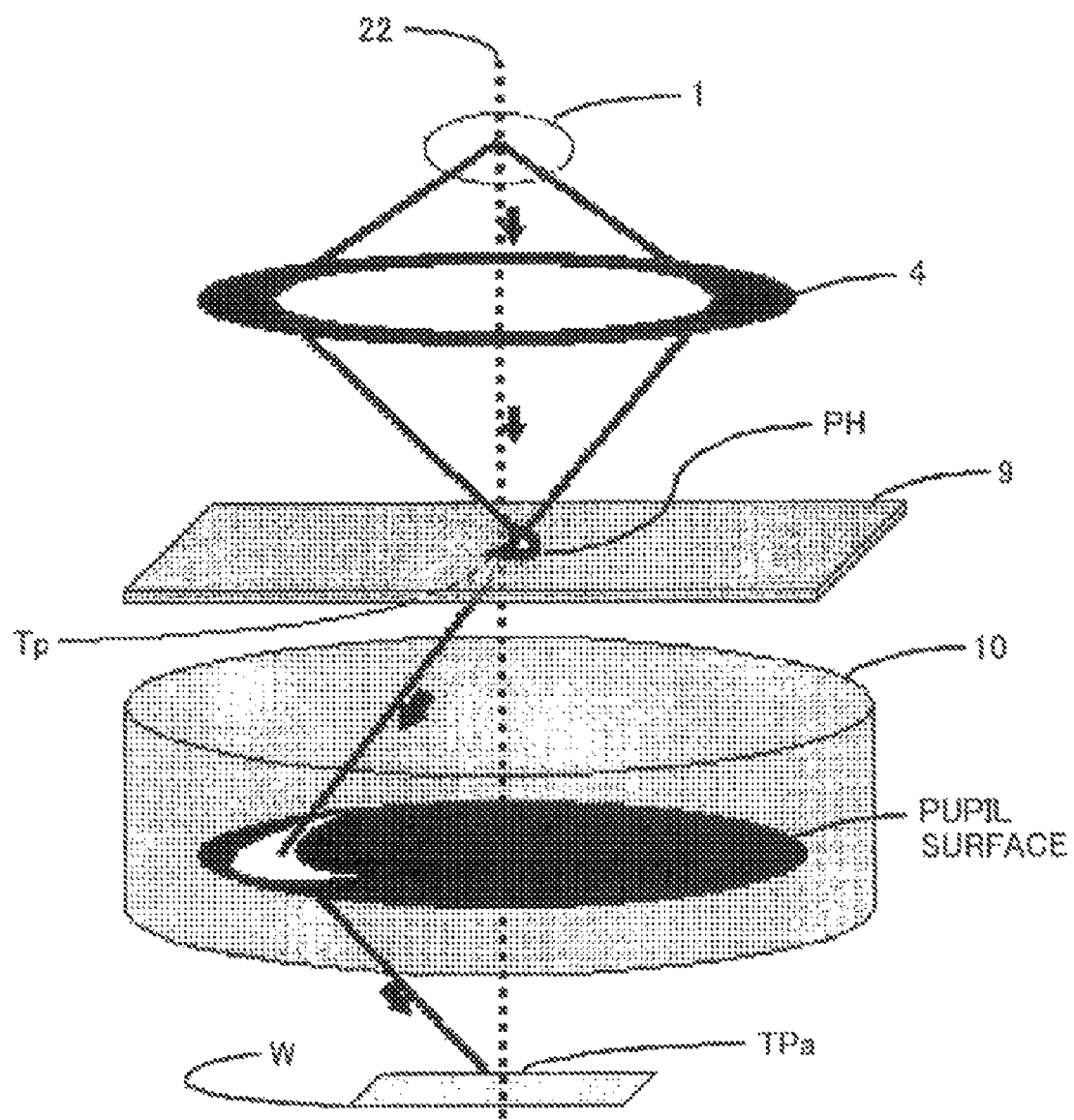
FIG. 1 is a typical view for explaining a measurement principle according to one embodiment of the present invention.

Referring to FIG. 1, a description will be given of a measurement principle according to another embodiment of the present invention. This embodiment uses an illumination optical system and a reticle having a special optical element to irradiate the illumination light whose principal ray LP satisfies σ>1 or has an angle spread corresponding to σ=1, onto the pattern ("test pattern") TP formed on the reticle 9 and light shielding part and opening part PH, which are formed on the opposite surface to the test pattern TP, and measures a position of an aerial image or a pattern image TPa transferred onto a photosensitive substrate W, imaged by the test pattern TP on the reticle 9's bottom surface using the light that passes the opening part PH in the reticle 9's top surface. 22 denotes an optical axis. A shape and position of the opening part PH formed in the opposite surface are those designed by the concepts of Japanese Patent Applications, Publication Nos. 2003-178968 and 2003-318090, and have characteristic shapes for each aberration object to be measured. The test pattern and the opening part PH may be formed on another plate, rather than the reticle.

Plural patterns that are the same as the test pattern TP are formed on the reticle 9 near the test pattern TP. One PH is formed on the opposite surface to one TP so that the opening part PH corresponds to the test pattern TP. These PHs correspond to different opening parts or arranged rotationally symmetrically. The pattern images at the same image point for these TPs by slightly shifting a position of the reticle. The best focus position, Zernike coefficient and the real device aberration are measured in the same manner as the above method that is described with reference to FIG. 1 by measuring a position of one or more aerial images or transferred pattern images for these TPs.

Figure 3:
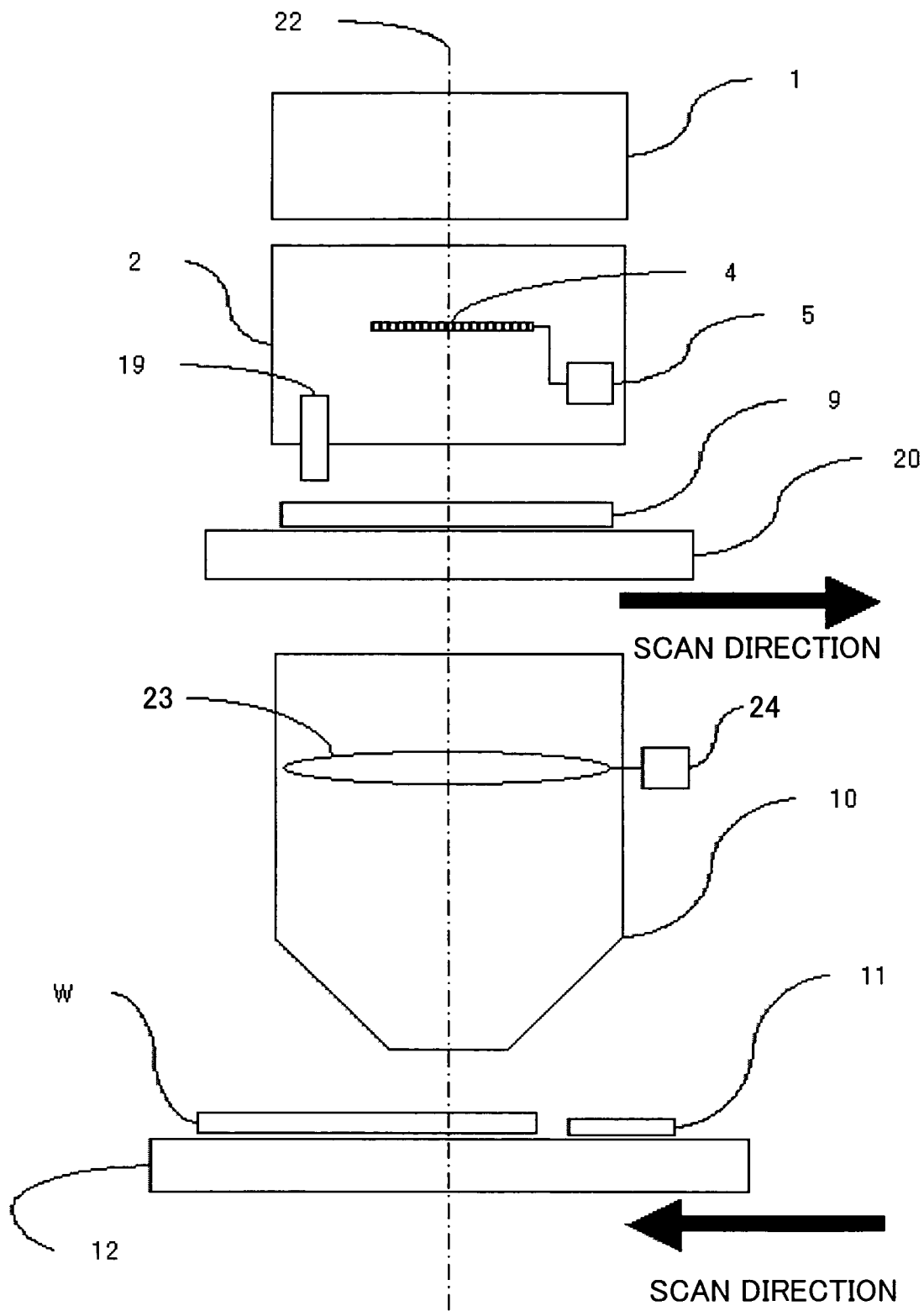
FIG. 3 is an optical-path diagram of an exposure apparatus according to one embodiment of the present invention.

Referring now to FIG. 3, a description will be given of a method according to the instant embodiment for measuring the aberration of the projection optical system at the scan time using the above measurement principle. The measurement method of the instant embodiment is applicable to dioptric, catoptric and catadioptric projection optical systems.

Figure 4A:
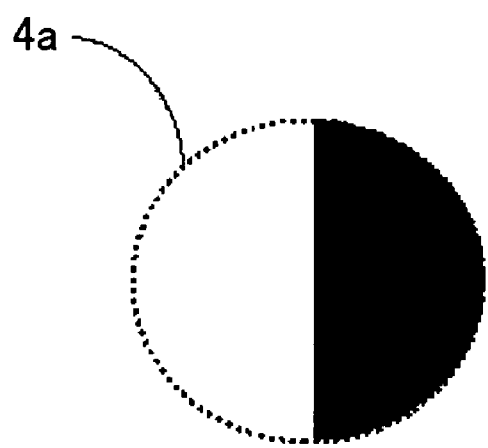
FIGS. 4A and 4B are views showing different rotational positions of an aperture stop in the exposure apparatus shown in FIG. 3.
Figure 4B:
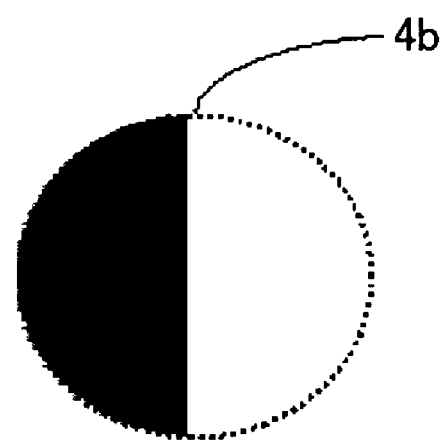
Figure 6:
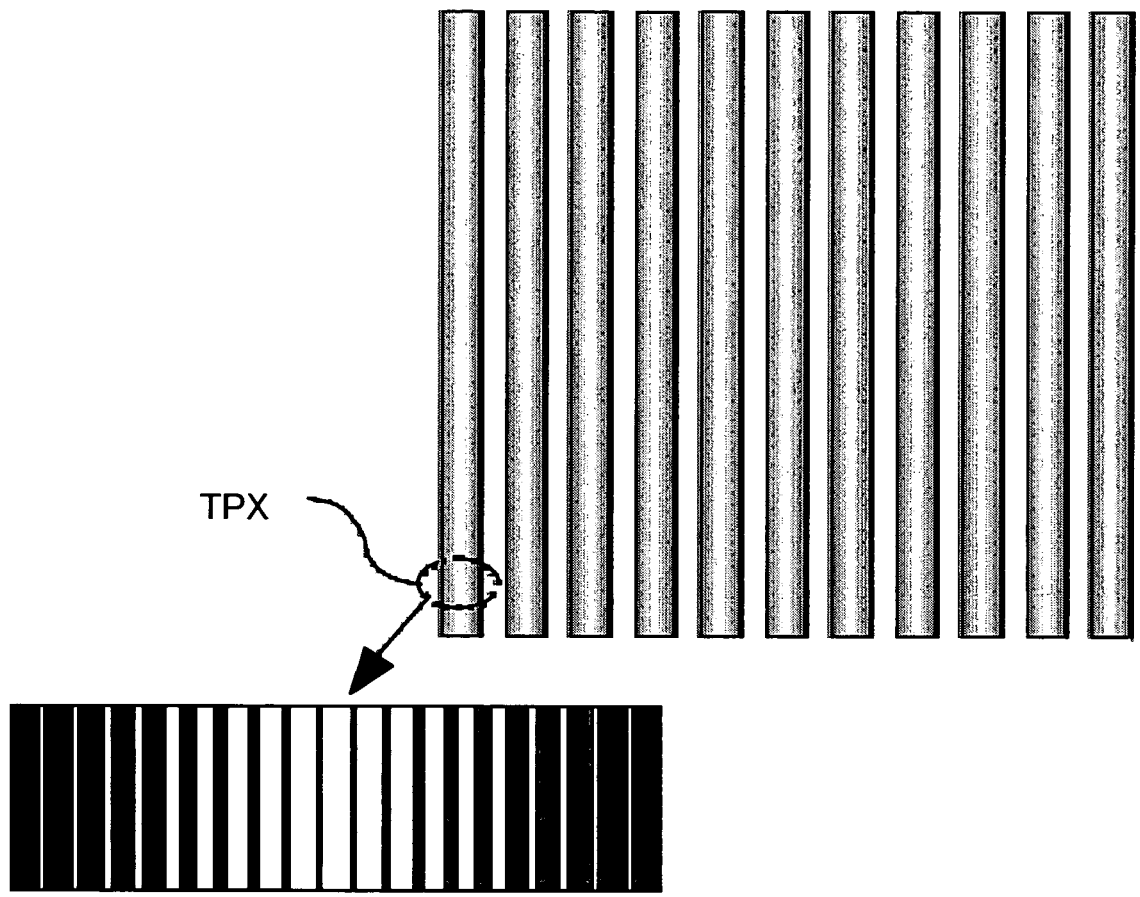
FIG. 6 is a plane view of a test pattern usable for the exposure apparatus shown in FIG. 3.
Figure 10:
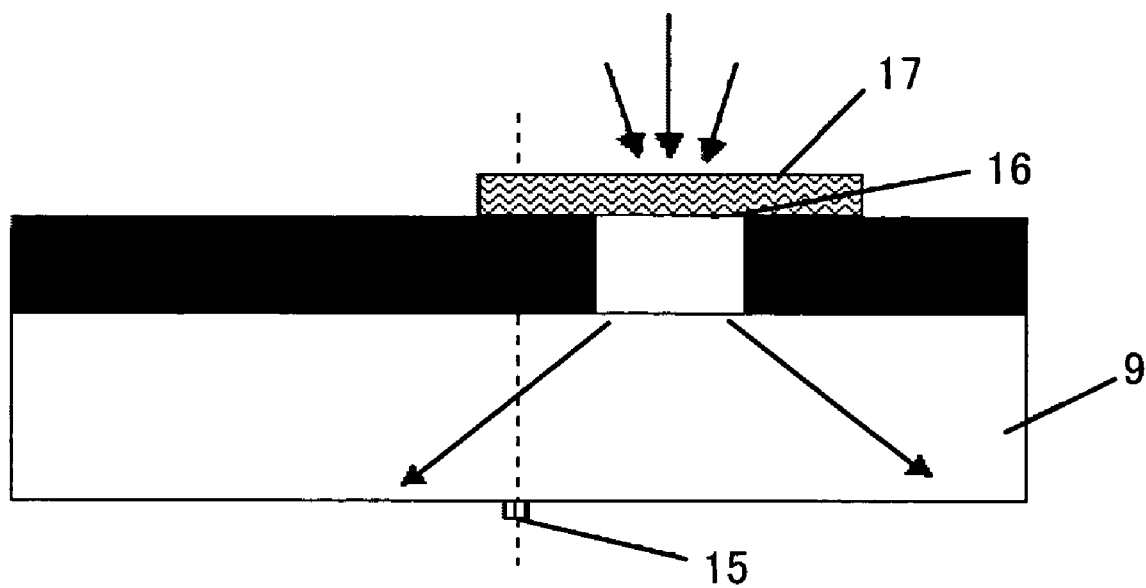
FIG. 10 is a schematic sectional view of another variation of the test reticle shown in FIG. 8.
Figure 11:
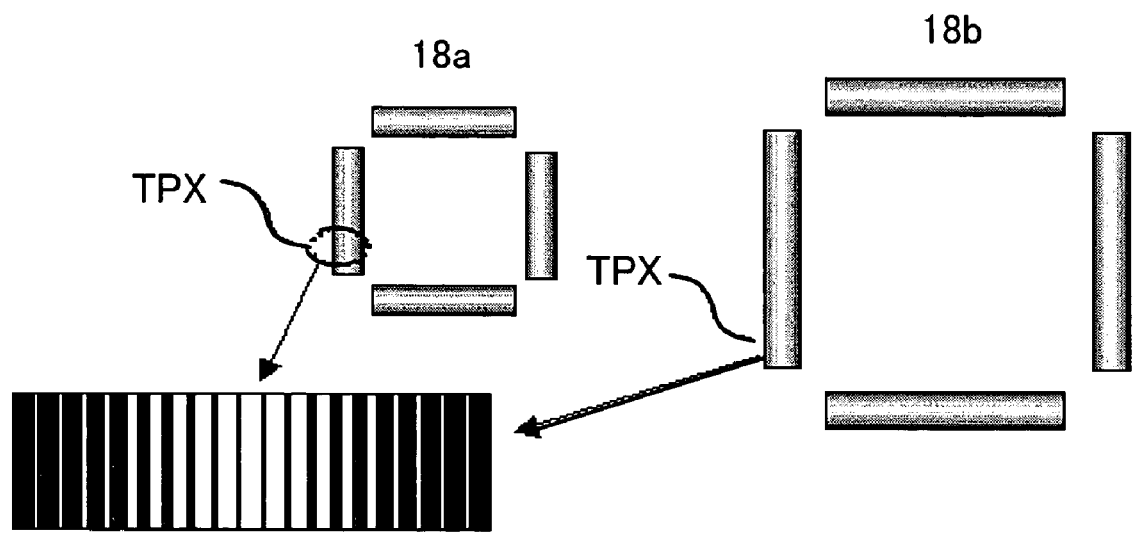
FIG. 11 is a plane view of a variation of the test pattern shown in FIG. 6.

The measurement light supplied from a light source 1 illuminates a reticle 9 via an illumination optical system 2. FIG. 6 shows a detailed view of a test pattern 15 to be used. The test pattern 15 is a line and space pattern, and each line TPX in this line and space pattern includes a finer line and space pattern shown in FIG. 5A or 5B, although each line in the mark shown in FIG. 6 has the same shape as that of FIG. 5B with respect to the internal entire width. The line width in FIG. 6 is not restricted, and the line width is set so that the finished width transferred on the photosensitive substrate W may satisfy the proper pattern size of the measuring apparatus for measuring the transfer pattern. Here, the line width is 2 μm. Marks 18a and 18b shown in FIG. 11 are exposed at a state of a rotational position of the illumination stop 4a shown in FIG. 4A by synchronously scanning the reticle stage 20 for supporting and driving the reticle 9 and the wafer stage 12 for supporting and driving the photosensitive substrate W in a reverse direction. Here, FIGS. 4A and 4B are plane views showing different rotational positions of the aperture stop 4. A ratio of the moving distance between the reticle stage 20 and the wafer stage 12 is adjusted to a reduction ratio of the projection optical system 10. Next, the wafer stage 12 is moved so that the marks 18a and 18b overlap each other, the drive system 5 turns the illumination aperture stop 4 from the state 4a to the state 4b shown in FIG. 4B by rotating the aperture stop 4 by 180°, and the marks 18a and 18b are scan-exposed in the same way. Here, the shape of the aperture stop 4 differs according to the type of the aberration to be sought, and the rotational angle and the number depend on the aberration type. The measuring apparatus measures relative positional offset amounts between the plural marks 18a and 18b transferred by these steps. A coefficient is calculated from the obtained positional offset amounts in accordance with the calculation process defined in FIG. 10 in Japanese Patent Application, Publication No. 2003-178968 and FIG. 23 in Japanese Patent Application, Publication No. 2003-318090.

The above approach can measure the aberration for each image point when the test patterns 18a and 18b are provided at some positions on the same reticle or on the different reticles.

The control accuracy of the focus and tilt of the exposure apparatus during scanning in the scan exposure can be measured in the similar procedure. The usually used illumination optical system's stop is the stops 4a and 4b shown in FIGS. 4A and 4B, which have the arc (or semicircular) shape having a radius smaller than σ=1, and used at rotational angles of 0° and 180°. Since Japanese Patent Application, Publication No. 2002-289494 discloses other combinations, and a description thereof will be omitted. The focus amount is calculated from a conversion equation and the obtained shift amount in the manner similar to the above. The focus amount and the shift amount have a linear relationship; when the conversion coefficient is previously calculated from experiments, the focus amount is calculated by multiplying the shift amount by the conversion coefficient.

A description will now be given of an embodiment in which the exposure apparatus adopts the measurement principle shown in FIG. 1. The exposure apparatus of the instant embodiment is similar to that shown in FIG. 3 except the exposure apparatus of the instant embodiment does not use the aperture stop 4, and the reticle has an opening part 16 corresponding to the test pattern 15 on the opposite surface of the test pattern 15. The illumination is exposure of a normal illumination condition (large σ) or uses an irradiation through the scope 19. The opening part 16's shape and position on the back surface of the test reticle 9 are pursuant to values that have already been designed according to the type of the aberration to be measured. For one or more aberrations, plural differently shaped opening parts and corresponding test patterns are arranged on opposite surfaces.

Figure 7:
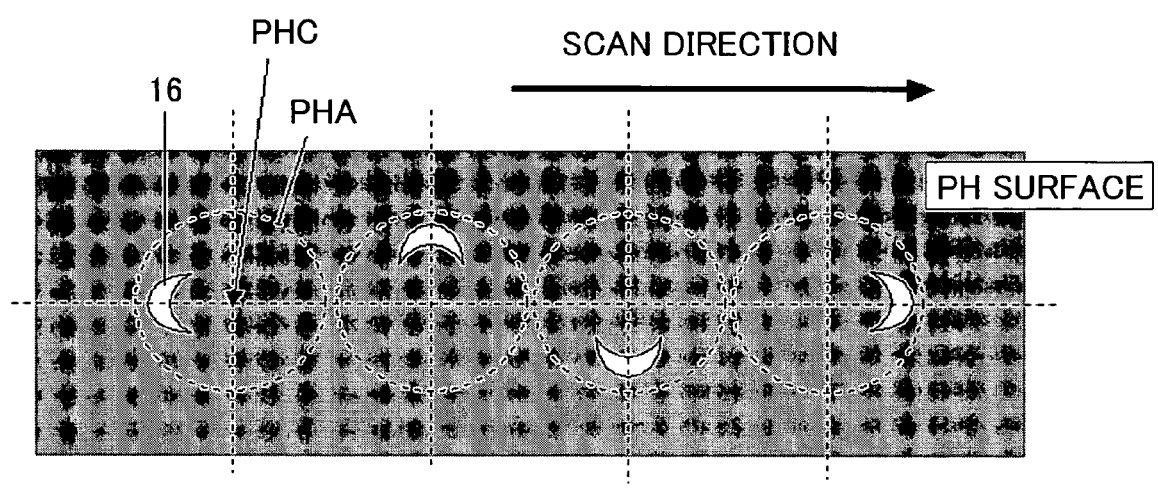
FIG. 7 is a schematic plane view of a test reticle used for a variation of the exposure apparatus shown in FIG. 3.

The test pattern is the same pattern in this embodiment. Plural sets of opening parts and test patterns are arranged near the image point to be measured. FIG. 7 is one arrangement example of the test reticle viewed from the opening parts. In the example shown in FIG. 7, a series of opening parts 16 are arranged parallel to the scan direction of the reticle stage. Of course, the test patterns corresponding to the centers PHCs of these opening parts 16 are provided on the opposite surface. The opening parts 16 enclosed by the PHAs are arranged and spaced by σ of 1.0 or greater, and the light other than the light the corresponding opening part is designed not to affect the test pattern. In this case, the series of test patterns can be measured at the same image point by scanning the reticle stage.

Figure 8:
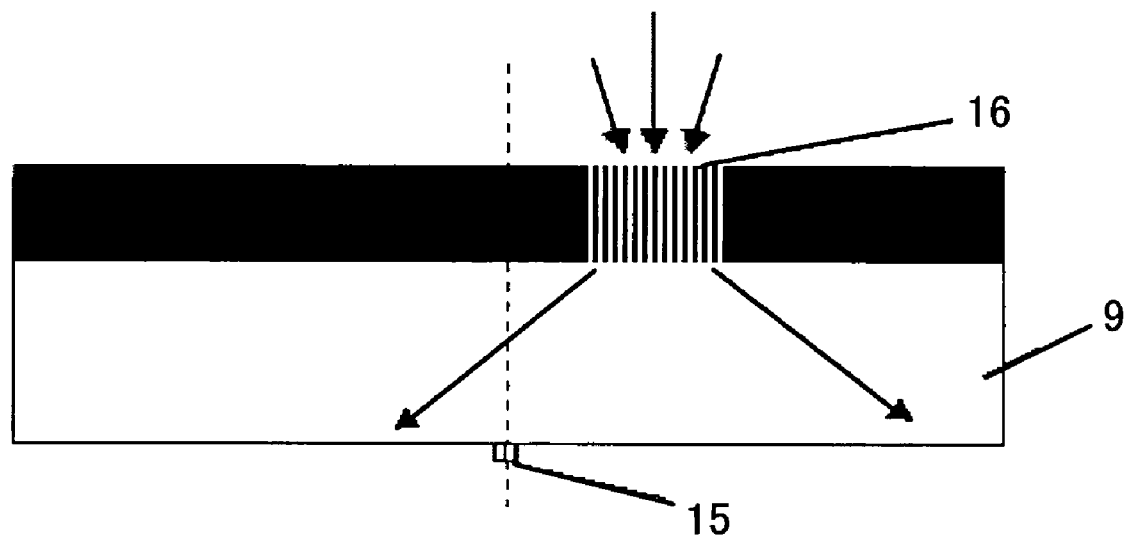
FIG. 8 is a schematic sectional view of a test reticle shown in FIG. 7.
Figure 9:
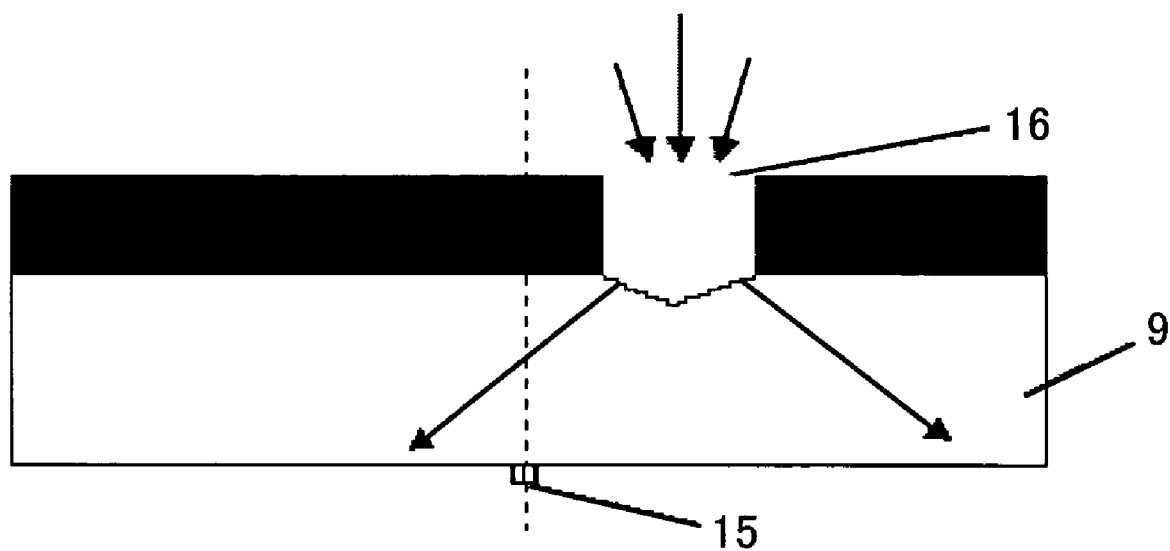
FIG. 9 is a schematic sectional view of a variation of the test reticle shown in FIG. 8.

When the incident angle of the illumination light supplied from the illumination optical system is smaller than σ of 1.0 and the incident angle of σ of 1.0 or greater is necessary, a chrome pattern that causes diffusions is arranged in the glass surface of the opening part 16 as shown in FIG. 8, or a step structure is provided to the glass part for diffusions as shown in FIG. 9. A CGH may also be used. An alternative embodiment diffuses the light to supply the illumination of σ of 1.0 or greater to the test pattern 15 and flattens the effective light source distribution of the exposure apparatus, by providing an optical element 17 at the top of the opening part 16 as shown in FIG. 10. The optical element 17 may be located above and slightly spaced from the test reticle 9, or may be inserted into the illumination optical system 2, for example, near the reticle blind, so as to obtain similar effects.

Figure 12:
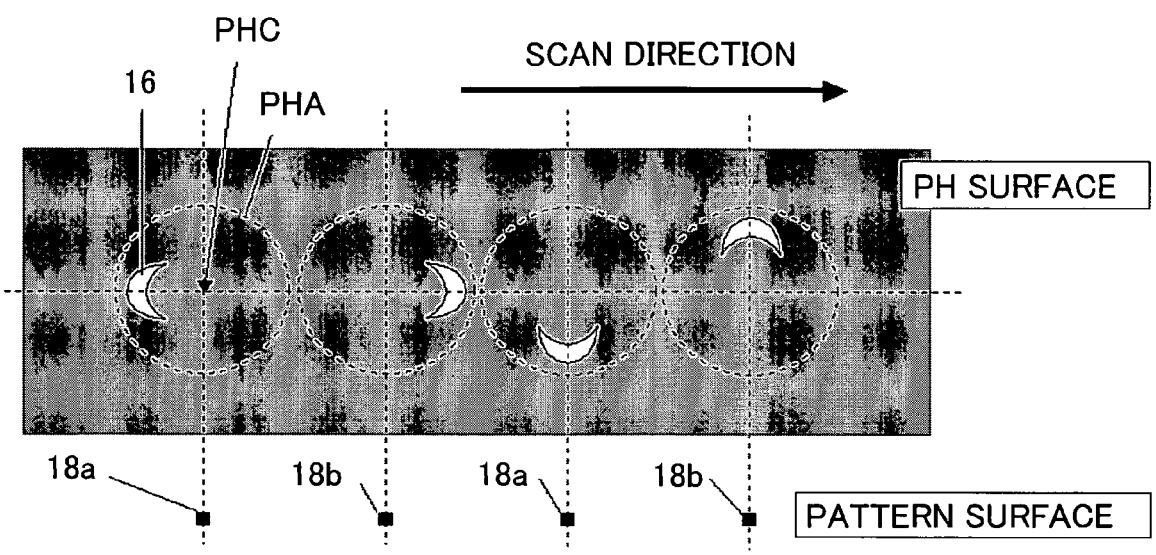
FIG. 12 is a plane view showing a scan embodiment that uses the pattern shown in FIG. 1.

FIG. 11 shows a mark arrangement example. Plural marks 18a and 18b are located near the image points to be measured on the test reticle 9, and differently shaped opening parts are formed on the surface opposite to these marks. As shown in FIG. 12, the reticle stage 20 is driven so that the center position of the test pattern moves to the image point position to be measured, and the mark is scan-exposed on the photosensitive substrate W. Then, the reticle stage 20 is driven by a predetermined amount, and differently sized mark is scan-exposed so that these exposed marks overlap each other. In addition, a position of the wafer stage 12 is driven, the above steps are repeated in an unexposed area, and all of the series of test patterns are exposed and overlapped. The positional offsets among the overlapping marks are measured by the known offset measuring apparatus after the development, and then the Zernike coefficients are extracted or the aberration of the real device is calculated.

Figure 13:
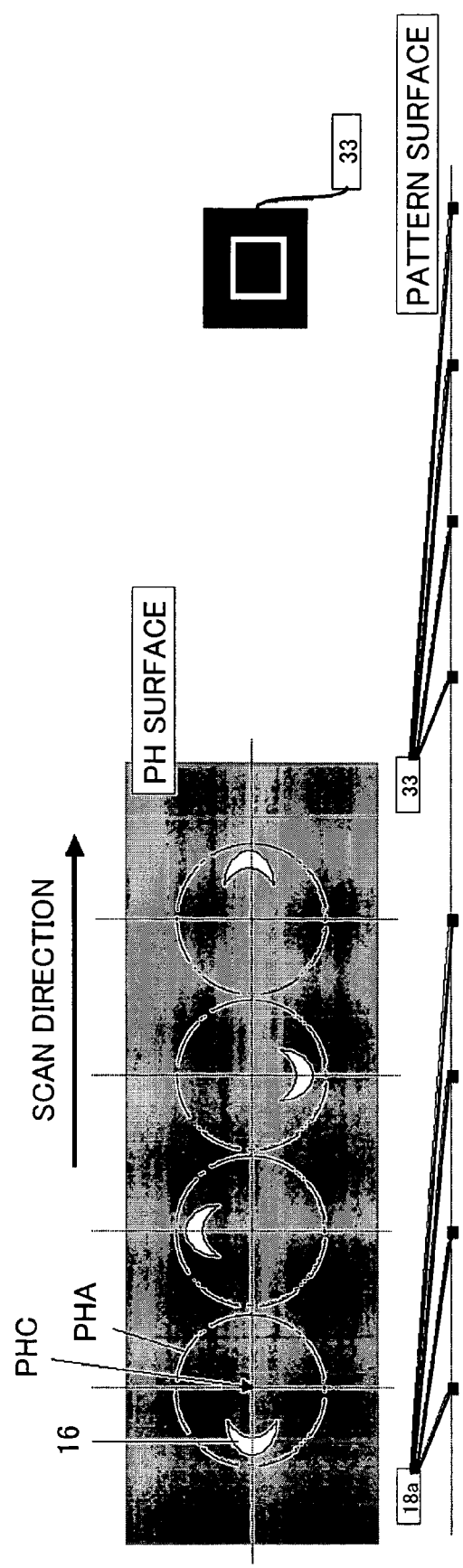
FIG. 13 is a plane view of a variation of the embodiment shown in FIG. 12.
Figure 14:
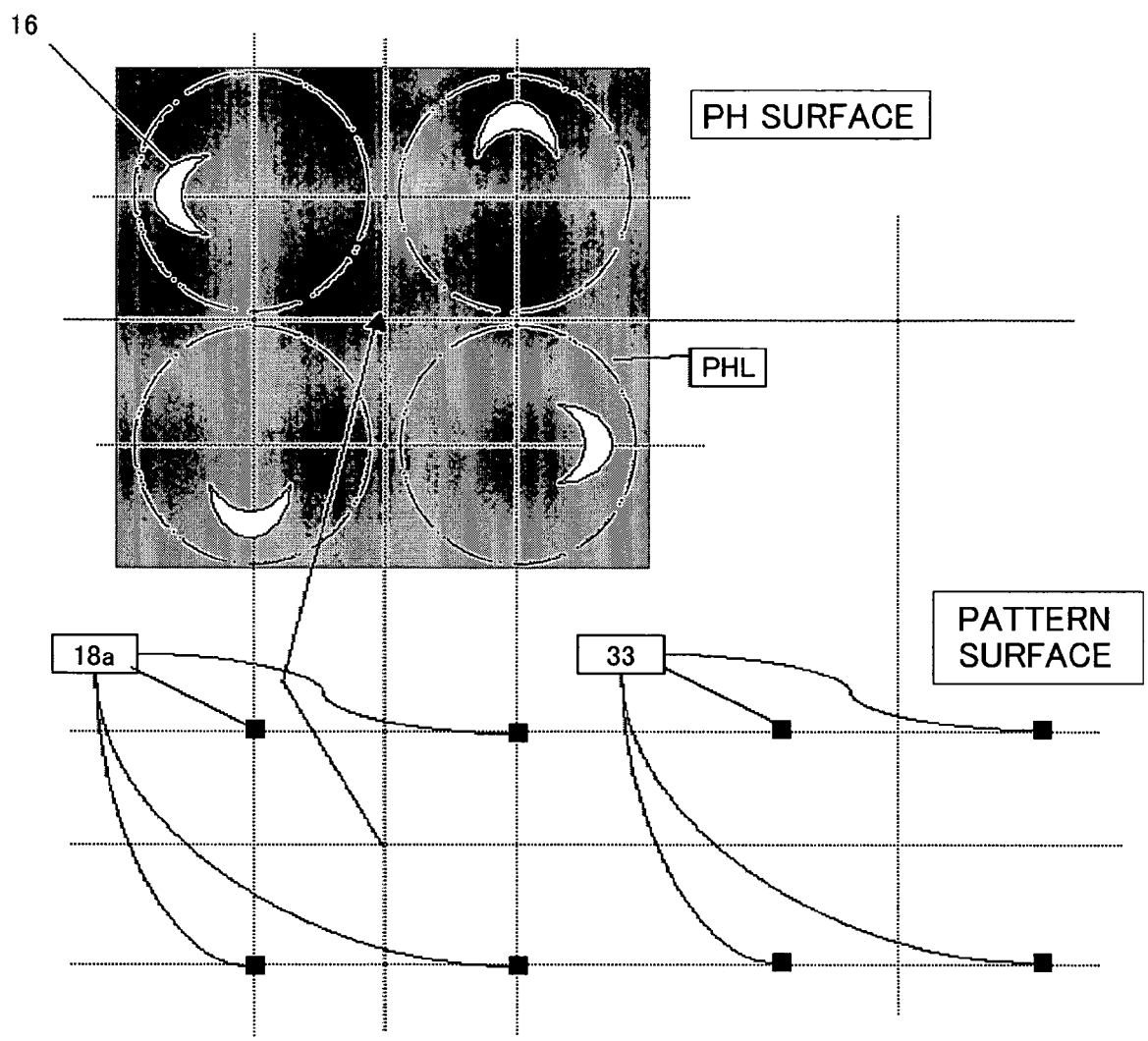
FIG. 14 is a plane view of another variation of the embodiment shown in FIG. 12.

An alternative embodiment scan-exposes the same mark 18a in the above approach. Then, instead of changing the mark size for each opening part, a reference mark 33 that is located at another reticle area and has a different mark size is moved to the wafer stage or the reticle stage and exposed so that the reference mark 33 overlaps the mark 18a. FIG. 13 shows this embodiment. A type of the reference mark is not restricted as long as the overlapped mark is measurable. It is preferable that the opening part and shielding part located above be simply a perforation. It is unnecessary to linearly arrange the mark 18a and the opening part 16. FIG. 14 shows this embodiment.

Figure 15B:
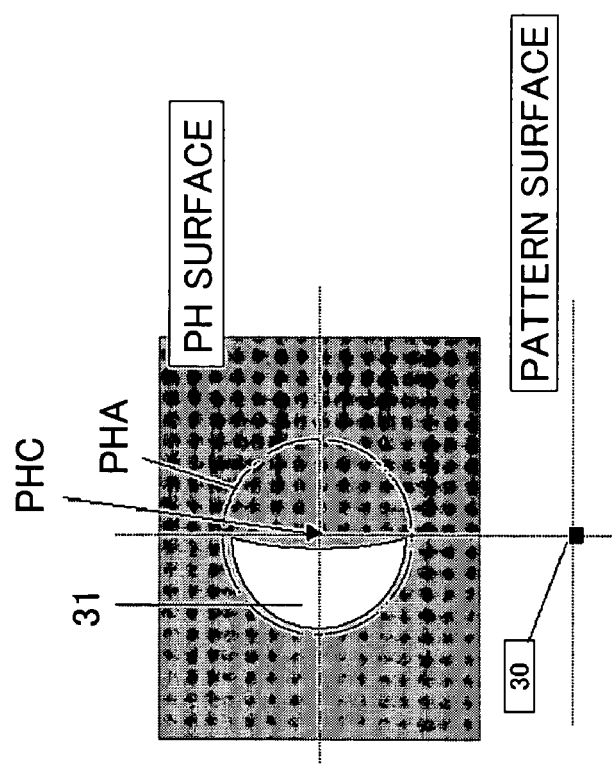
FIGS. 15A and 15B are plane views of another variation of the embodiment shown in FIG. 12.
Figure 15A:
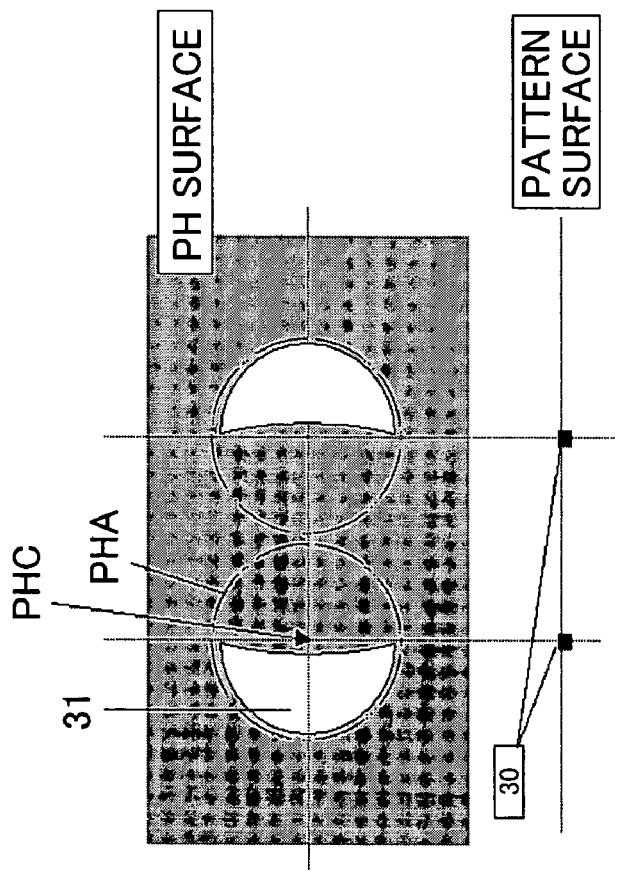

An embodiment that measures focus and tilt changes at the time of scanning forms the oblique incident illumination using the opening part 16 on the reticle 9, irradiates the light onto the test pattern 15 through scanning, and measures an offset of the formed image. The image formed by the oblique incident illumination causes a positional offset due to the focus position on the imaging surface. Since a relationship between this positional offset amount and the focus amount approximately accords with the incident angle of the oblique incident illumination, the focus change can be measured if the positional offset of the pattern during the scanning can be detected. The tilt change can also be measured by providing a pattern in the image point direction of the projection lens if the positional offset during the scanning can be detected. FIGS. 15A and 15B show a positional relationship between the test pattern 30 and the opening part 31 to be used. The internal TPX of each line which appears to be a line and space of the test pattern 30 has a similar structure as that shown in FIG. 11.

The instant embodiment provides the opening part 31 corresponding to the test pattern 30 on the opposite surface of the test pattern 30 on the reticle 9. The illumination is exposure of a normal illumination condition (large σ) or uses an irradiation through the scope 19. The opening part 31's shape and position on the back surface of the test reticle 9 may receive the oblique incident illumination, and the opening part 31 may be dimensioned so that the illumination incident angle is close to σ=1 and the light intensity matches the scan speed. each set of the test pattern 30 and the opening 31 is arranged in the image-point direction at proper intervals, and the row is arranged also in the scan direction at proper intervals on the reticle 9.

Figure 16:
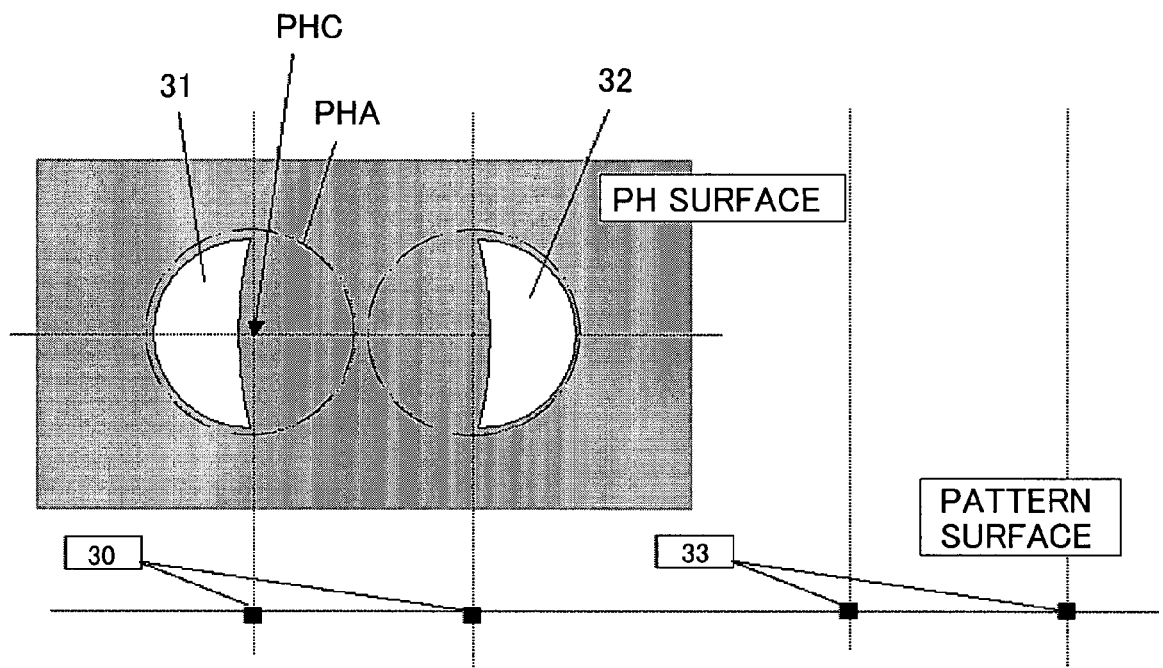
FIG. 16 is a plane view of another variation of the embodiment shown in FIG. 12.

FIG. 16 shows an embodiment that arranges each set in a manner similar to the above embodiment, wherein each set is a combination of an opening part 32 that has a point symmetrical relationship with the opening part 31, and a test pattern illuminated via the opening part 32. A difference between two examples in FIG. 16 is that one scan exposure results in an observation of the positional offset twice and improves the measurement accuracy, when each set has a pair of sets each of which includes one opening part and one mark.

A description will now be given of the arrangement example of the test reticle in the embodiment that includes two opening parts 31 and 32 shown in FIG. 16. In the embodiment shown in FIG. 16, a series of openings 31 and 32 are arranged parallel to the scan direction of the reticle stage. Of course, the test patterns corresponding to the centers PHCs of these opening parts are provided on the opposite surface. The opening parts 31 and 32 may be arranged orthogonal to the scan direction of the reticle stage 20. While this embodiment discusses the incident angle upon the opening part and the test pattern only in the X direction, they may be arranged in the Y direction so that there are four sets as in the embodiment shown in FIG. 14. When they are arranged in the 45° direction, eight sets can be secured (not shown). The opening parts 31 and 32 enclosed by the PHA are spaced from each other by a distance of σ=1.0 or greater, preventing the test pattern from being affected by the lights other than the light corresponding to the opening parts.

A reference mark 33 is located which is different in mark size from the test pattern 30 that is located in the other reticle area. A light shielding part above the reference mark 33 is not particularly necessary. The reference mark 33 does not have to be a special pattern like the test pattern 30, and is a frame mark having a width of 2 μm in this embodiment. If an incident angle of the illumination light supplied from the illumination optical system 2 is smaller than σ=1.0 and a wider illumination incident angle is needed or a flat light intensity distribution is necessary, an optical element, such as a diffuser panel and a CGH, is inserted into the illumination optical system or arranged at the opposite surface of the test pattern. A description will be given of the procedure. The procedure includes the steps of setting the test reticle 30, provides scan-exposure after the illumination condition is driven or set to the predetermined, and transfers the entire pattern on the test reticle 9 onto the photosensitive substrate (wafer) W. In general, the illumination condition in this case is the large σ condition. Next, this embodiment moves the wafer stage 12, and provides the scan exposure again, transfers the test pattern 30 so that the test pattern 30 overlap the reference mark 33. The transferred image is developed, and the positional offset measuring apparatus calculates the positional offset, and converts the positional offset into the focus and tilt amount from the predetermined conversion coefficient.

Figure 17:
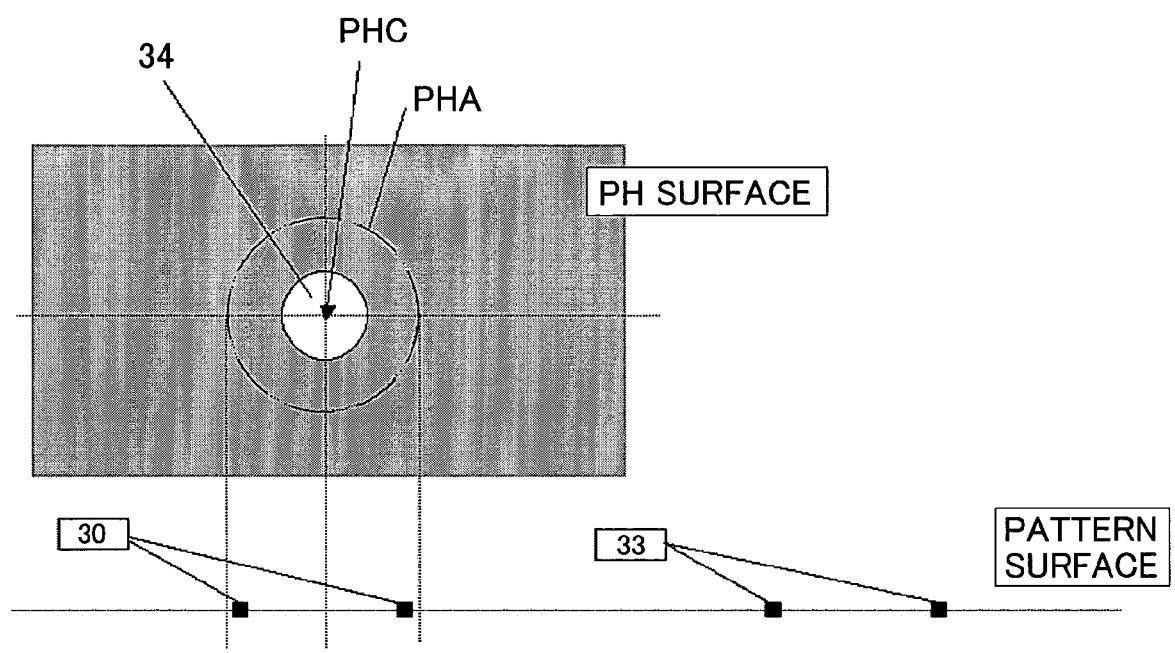
FIG. 17 is a plane view of a variation of the embodiment shown in FIG. 16.
Figure 18:
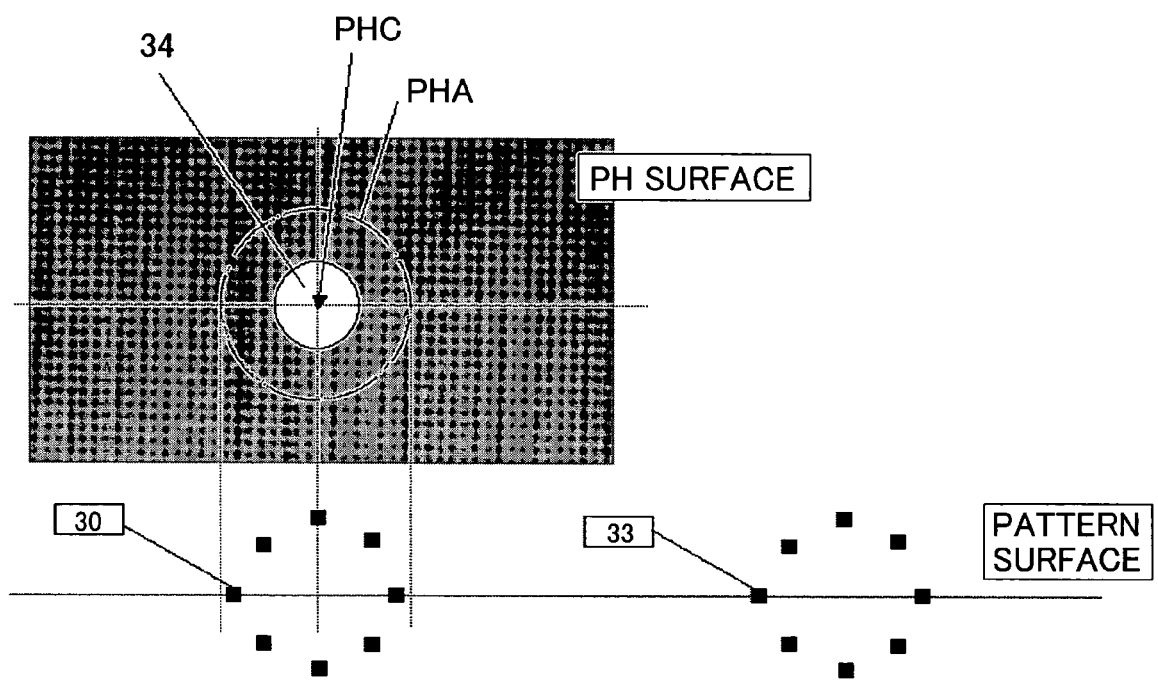
FIG. 18 is a plane view of a variation of the embodiment shown in FIG. 17.

Another embodiment arranges, as shown in FIG. 17, two test patterns 30 for one opening part 34 so that these test patterns 30 are spaced from the center of the opening part 34 by the same distance and σ is smaller than 1. This embodiment also provides similar measurement effects to the above embodiment by exposing the reference marks 33 are exposed so that the reference marks 33 overlap the test patterns. In this case, a shape of the opening part 34 is made a normal pinhole. In the embodiment shown in FIG. 17, a series of opening parts 34 are arranged parallel to the scan direction of the reticle stage. Of course, the test patterns corresponding to the centers PHCs of these opening parts are provided on the opposite surface. The opening part 34 may be arranged orthogonal to the scan direction of the reticle stage. While this embodiment discusses the incident angle upon the opening part and the test pattern only in the X direction, they may be arranged in the Y direction so that there are four sets. When they are arranged in the 45° direction, there are eight sets (FIG. 18).

Alternatively, a CCD camera provided on the wafer stage in the apparatus can photograph the aerial image to measure the center position of the image.

By feeding back the obtained measurement values to the body system, as shown in FIG. 3, the driving system 24 drives the correction optical system 23 in the projection optical system 10. A correction means for feeding back the corrective values to the offset table for scan driving, etc., can be used to correct scan exposure by the exposure apparatus. The correction optical system 23 allows plural optical elements (not shown) in the projection optical system to move in the optical-axis direction and/or a direction orthogonal to the optical-axis direction. By driving one or more optical elements using the driving system 24 for aberrational adjustments based on aberrational information obtained from the instant embodiment, it is possible to correct or optimize one or more aberrations of the projection optical system, in particular Seidel's classification of aberrations. The means for adjusting the aberration of the projection optical system can use various known system, such as a movable lens, a movable mirror (when the projection optical system is a catadioptric optical system or full-mirror optical system), an inclinable parallel plate, a pressure-controllable space, and a surface correction using an actuator.

The exposure apparatus includes an illumination apparatus (not shown) which is different from or the same as the measuring apparatus, a reticle that has a circuit pattern of semiconductor devices (such as a semiconductor chip, e.g., ICs and LSI, a liquid crystal panel, and a CCD), and a plate, and exposes the circuit pattern on the reticle onto the plate, for example, in the step and scan manner. The inventive exposure apparatus is not limited to the scanner, but it precisely measures and corrects the optical performance in the projection optical system in the scanner.

Figure 19:
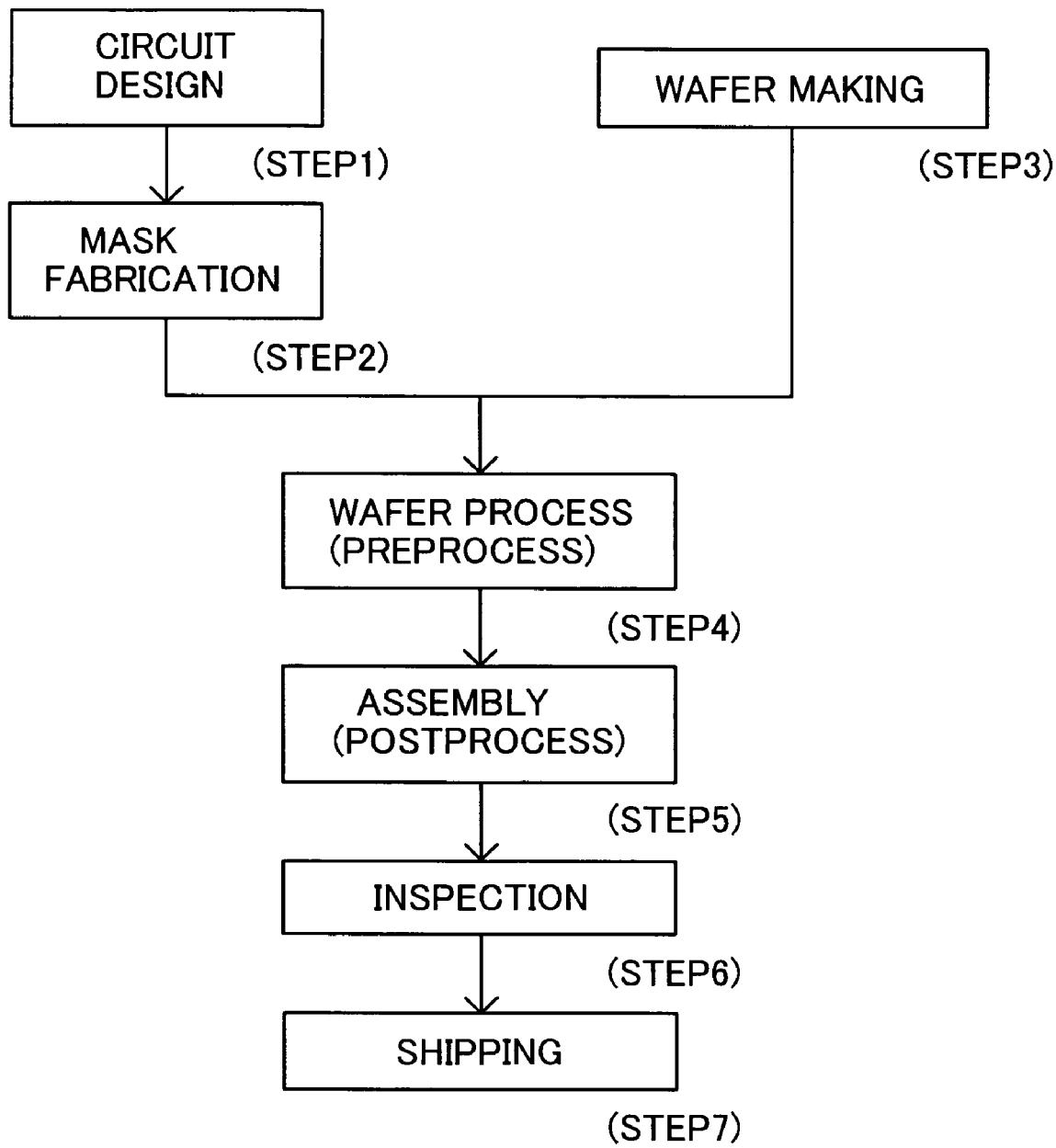
FIG. 19 is a flowchart for explaining a method for fabricating devices (semiconductor chips such as ICs, LSIs, and the like, LCDs, CCDs, etc.).

A description will now be given of an embodiment of a device manufacturing method using the above exposure apparatus. FIG. 19 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 20:
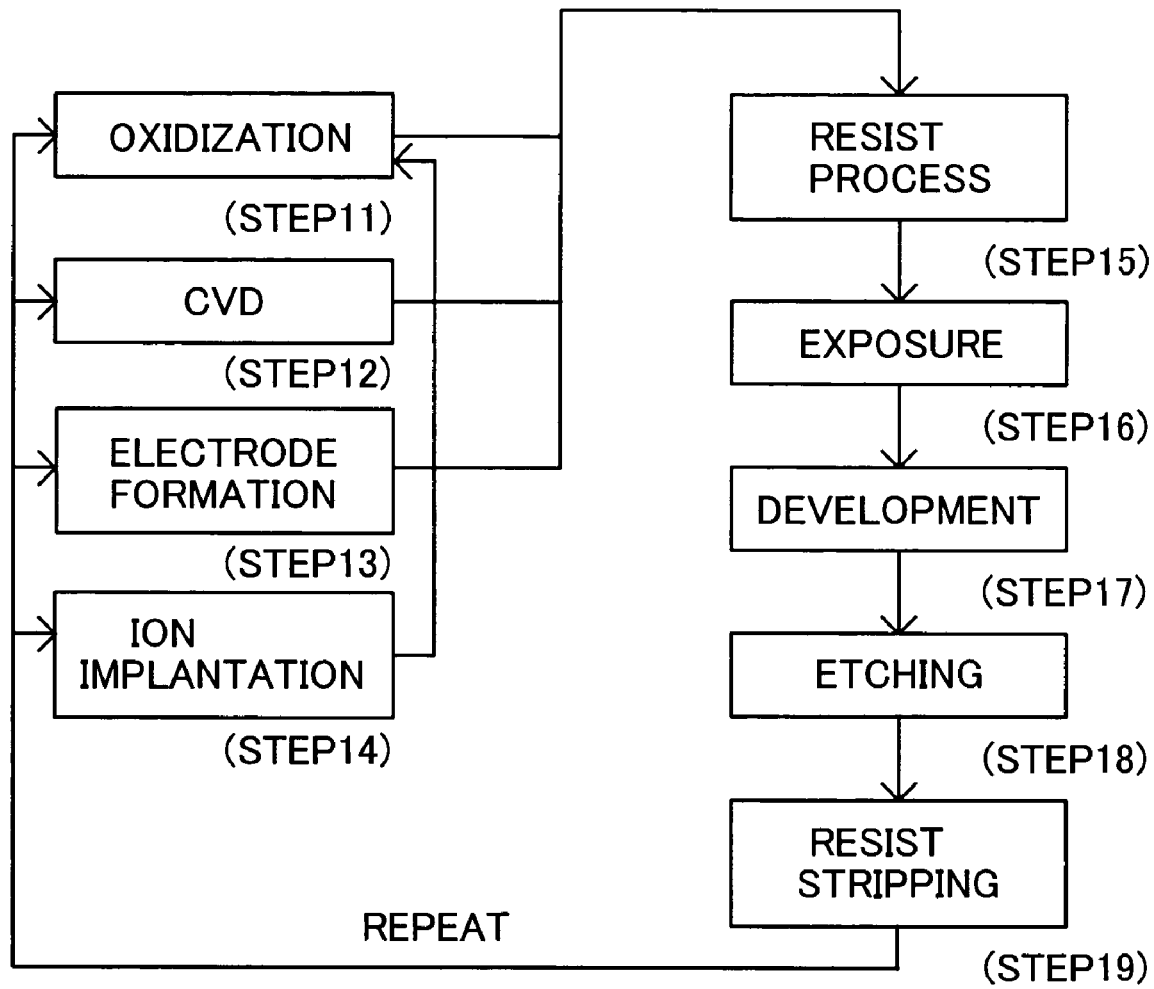
FIG. 20 is a detailed flowchart for Step 4 of wafer process shown in FIG. 19.

FIG. 20 is a detailed flowchart of the wafer process in Step 4 in FIG. 19. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacture method of the present invention may manufacture higher quality devices than the conventional one.

Thus, the present invention can provide a measuring method and apparatus for measuring the aberration and the best focus position of a target optical system more precisely than the prior art, an exposure method and apparatus using the same, and a device manufacturing method.

Further, the present invention is not limited to these preferred embodiments, and various modifications and changes may be made in the present invention without departing from the spirit and scope thereof. For example, the present invention is applicable, for example, to use of the light-receiving element provided on the wafer stage to measure the light intensity on the wafer stage and the transmittance of the projection optical system.

This application claims foreign priority benefits based on Japanese Patent Application No. 2003-417212, filed on Dec. 15, 2003, which is hereby incorporated by reference herein in its entirety as if fully set forth herein.

What is claimed is:

1. A method for measuring optical performance of a projection optical system in an exposure apparatus, said method comprising:

placing an illumination stop for oblique illumination, the illumination stop having a predetermined optimized shape in an illumination optical system, wherein the shape of the illumination stop is optimized in accordance with a specific Zernike term;

determining an area of a pupil in a pupil plane of the projection optical system based on said predetermined optimized shape;

scanning a test reticle or a reference plate;

imaging a test pattern on the test reticle or the reference plate onto a photosensitive substrate during said scanning step via the area of said pupil which has been determined by said determining step, wherein light intensity distribution at the determined area of said pupil is substantially similar to the predetermined optimized shape of said illumination stop; and measuring a positional offset between a predetermined position of the test pattern and an image of the test pattern that has been imaged by said imaging step, wherein light that passes through the determined area of the pupil is restricted by the test pattern and the illumination stop so that the positional offset of the test pattern image with respect to the predetermined position has a 1:1 relationship with a coefficient of the specific Zernike term.

2. The method according to claim 1, wherein the test reticle or the reference plate has plural sets of test patterns in the scan direction of said scanning step, and said measuring step measures a focus change in the scan direction.

3. The method according to claim 1, wherein the test reticle or the reference plate has plural sets of test patterns in a scan direction of said scanning step and in an image surface direction of the projection optical system, and said measuring step measures a tilt change in the scan direction.

4. The method according to claim 1, wherein the shape of the illumination stop differs in accordance with a type of aberration to be measured.

5. The method according to claim 1, wherein the light that passes through the determined area of the pupil changes direction by rotating the illumination stop.

6. The method according to claim 5, wherein the area or the pupil changes position in said pupil plane in accordance with a rotational position of the illumination stop.

7. A method for measuring optical performance of a projection optical system in an exposure apparatus, said method comprising:

placing a test reticle for oblique illumination including a test pattern formed on a front surface of the test reticle and an opening part formed on a rear surface of the test reticle, the opening part having a predetermined optimized shape, wherein the shape of the opening part is optimized in accordance with a specific Zernike term, and wherein the front surface is arranged on an object plane of the projection optical system and the rear surface is arranged at a side of the illumination optical system compared to the object plane;

determining an area of a pupil in a pupil plane of the projection optical system based on said predetermined optimized shape;

scanning the test reticle;

imaging the test pattern on the test reticle onto a photosensitive substrate during said scanning step via the area of said pupil which has been determined by said determining step, wherein light intensity distribution at the determined area of said pupil is substantially similar to the predetermined optimized shape of said opening part; and measuring a positional offset between a predetermined position of the test pattern and an image of the test pattern that has been imaged by said imaging step, wherein light that passes through the determined area of the pupil is restricted by the test pattern and the opening part so that the positional offset of the test pattern image with respect to the predetermined position has a 1:1 relationship with a coefficient of the specific Zernike term.

* * * * *